United States Patent
Smith et al.

(10) Patent No.: US 9,293,622 B2
(45) Date of Patent: Mar. 22, 2016

(54) RE-EMITTING SEMICONDUCTOR CARRIER DEVICES FOR USE WITH LEDS AND METHODS OF MANUFACTURE

(75) Inventors: Terry L. Smith, Roseville, MN (US); Catherine A. Leatherdale, Woodbury, MN (US); Michael A. Haase, St. Paul, MN (US); Thomas J. Miller, Woodbury, MN (US); Xiaoguang Sun, Woodbury, MN (US); Zhaohui Yang, North Oaks, MN (US); Todd A. Ballen, St. Paul, MN (US); Amy S. Barnes, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 517 days.

(21) Appl. No.: 13/264,487

(22) PCT Filed: May 3, 2010

(86) PCT No.: PCT/US2010/033379
§ 371 (c)(1),
(2), (4) Date: Dec. 22, 2011

(87) PCT Pub. No.: WO2010/129464
PCT Pub. Date: Nov. 11, 2010

(65) Prior Publication Data
US 2012/0097983 A1    Apr. 26, 2012

Related U.S. Application Data

(60) Provisional application No. 61/175,636, filed on May 5, 2009.

(51) Int. Cl.
*H01L 31/055* (2014.01)
*H05B 33/10* (2006.01)
(Continued)

(52) U.S. Cl.
CPC .............. *H01L 31/055* (2013.01); *H05B 33/10* (2013.01); *H01L 33/0079* (2013.01); *H01L 33/502* (2013.01); *H01L 2933/0041* (2013.01)

(58) Field of Classification Search
CPC ...................................................... H01L 31/055
USPC ........................................ 257/84, 431, 80, 82
See application file for complete search history.

(56) References Cited

U.S. PATENT DOCUMENTS

| 3,526,801 A | 9/1970 | Kruse |
| 5,048,035 A | 9/1991 | Sugawara |

(Continued)

FOREIGN PATENT DOCUMENTS

| DE | 103 54 936 | 4/2005 |
| EP | 1 010 773 | 6/2000 |

(Continued)

OTHER PUBLICATIONS

Cavus et al., "N-type doping of lattice-matched ZnCdSe and ZnxCdyMgl-x-ySe epilayers on InP using ZnCl2", Journal of Applied Physics, vol. 84, No. 3, pp. 1472-1475, Aug. 1, 1998, © 1998 American Institute of Physics.

(Continued)

*Primary Examiner* — Yu-Hsi D Sun
(74) *Attorney, Agent, or Firm* — Yufeng Dong

(57) ABSTRACT

Re-emitting semiconductor constructions (RSCs) for use with LEDs, and related devices, systems, and methods are disclosed. A method of fabrication includes providing a semiconductor substrate, forming on a first side of the substrate a semiconductor layer stack, attaching a carrier window to the stack, and removing the substrate after the attaching step. The stack includes an active region adapted to convert light at a first wavelength $\lambda_1$ to visible light at a second wavelength $\lambda_2$, the active region including at least a first potential well. The attaching step is carried out such that the stack is disposed between the substrate and the carrier window, which is transparent to the second wavelength $\lambda_2$. The carrier window may also have a lateral dimension greater than that of the stack. The removal step is carried out so as to provide an RSC carrier device that includes the carrier window and the stack.

9 Claims, 9 Drawing Sheets

(51) Int. Cl.
*H01L 33/00* (2010.01)
*H01L 33/50* (2010.01)

(56) References Cited

U.S. PATENT DOCUMENTS

| | | | |
|---|---|---|---|
| 5,513,204 A * | 4/1996 | Jayaraman | 372/96 |
| 5,600,158 A | 2/1997 | Noto | |
| 5,861,717 A | 1/1999 | Begemann | |
| 6,016,038 A | 1/2000 | Mueller | |
| 6,636,003 B2 | 10/2003 | Rahm | |
| 6,902,987 B1 | 6/2005 | Tong | |
| 7,026,653 B2 | 4/2006 | Sun | |
| 7,078,319 B2 | 7/2006 | Eliashevich | |
| 7,126,160 B2 | 10/2006 | Sun | |
| 7,141,445 B2 | 11/2006 | Sugawara | |
| 7,202,613 B2 | 4/2007 | Morgan | |
| 7,217,959 B2 | 5/2007 | Chen | |
| 7,223,998 B2 | 5/2007 | Schwach | |
| 7,279,716 B2 | 10/2007 | Chen | |
| 7,288,902 B1 | 10/2007 | Melanson | |
| 7,358,679 B2 | 4/2008 | Lys | |
| 7,361,938 B2 | 4/2008 | Mueller | |
| 7,387,405 B2 | 6/2008 | Ducharme | |
| 7,402,831 B2 | 7/2008 | Miller | |
| 7,417,260 B2 | 8/2008 | Wuu | |
| 2002/0182319 A1 | 12/2002 | Ben-Malek | |
| 2003/0010987 A1 | 1/2003 | Banin | |
| 2005/0110034 A1 | 5/2005 | Fujiwara | |
| 2005/0230693 A1 | 10/2005 | Chen | |
| 2005/0274967 A1 | 12/2005 | Martin | |
| 2005/0280013 A1 | 12/2005 | Sun | |
| 2006/0001056 A1 | 1/2006 | Saxler | |
| 2006/0124917 A1 | 6/2006 | Miller | |
| 2006/0202215 A1 | 9/2006 | Wierer, Jr. | |
| 2007/0221867 A1 | 9/2007 | Beeson | |
| 2007/0284565 A1 | 12/2007 | Leatherdale | |
| 2007/0284592 A1 * | 12/2007 | Haase | 257/79 |
| 2007/0290190 A1 | 12/2007 | Haase | |
| 2008/0111123 A1 | 5/2008 | Tu | |
| 2008/0230795 A1 | 9/2008 | Dias | |
| 2008/0272712 A1 | 11/2008 | Jalink | |
| 2008/0297027 A1 | 12/2008 | Miller | |
| 2009/0014736 A1 | 1/2009 | Ibbetson | |
| 2009/0108269 A1 | 4/2009 | Negley | |
| 2010/0117997 A1 | 5/2010 | Haase | |
| 2010/0237357 A1 * | 9/2010 | Tsai et al. | 257/79 |

FOREIGN PATENT DOCUMENTS

| | | |
|---|---|---|
| EP | 1 517 379 | 3/2005 |
| JP | 61-144078 | 7/1986 |
| JP | 2000-091707 | 3/2000 |
| KR | 10-0829925 | 8/2008 |
| WO | WO 00/76005 | 12/2000 |
| WO | WO 2006/062588 | 6/2006 |
| WO | WO 2007/034367 | 3/2007 |
| WO | WO 2007/073449 | 6/2007 |
| WO | WO 2007/114614 | 10/2007 |
| WO | WO 2008/109296 | 9/2008 |
| WO | WO 2009/036579 | 3/2009 |
| WO | WO 2009/048704 | 4/2009 |
| WO | WO 2009/148717 | 12/2009 |
| WO | WO 2009/158138 | 12/2009 |
| WO | WO 2009/158191 | 12/2009 |
| WO | WO 2010/019594 | 2/2010 |
| WO | WO 2010/027648 | 3/2010 |
| WO | WO 2010/028146 | 6/2010 |
| WO | WO 2010/074987 | 7/2010 |
| WO | WO 2010/129409 | 11/2010 |
| WO | WO 2010/129412 | 11/2010 |
| WO | WO 2011/002686 | 1/2011 |
| WO | WO 2011/008474 | 1/2011 |
| WO | WO 2011/008476 | 1/2011 |

OTHER PUBLICATIONS

Chang et al., "MBE Growth and Characterization of (ZnMG) (SeTe)", Journal of the Korean Physical Society, vol. 34, pp. S4-S6, Apr. 1999.

Cie, International Commission on Illumination, Technical Report, ISBN 978 3 900734 57 2, 13.3, 1995.

Guo et al., "Photon Recycling Semiconductor Light Emitting Diode", IEEE Xplore, 4 pages, Downloaded on Oct. 29, 2008, © 1999 IEEE.

Horng et al., "Phosphor-Free White Light From InGaN Blue and Green Light-Emitting Diode Chips Covered With Semiconductor-Conversion AlGaInP Epilayer", IEEE Photonics Technology Letters, vol. 20, No. 13, pp. 1139-1141, Jul. 1, 2008.

Horng et al., "Red-enhanced white light-emitting diodes using external AlGaInP epilayers with various aperture ratios", Journal of Luminescence, vol. 128, pp. 647-651, 2008, © 2007 Elsevier B.V.

Jones, E. D., "Diffusion of Indium Into Cadmium Sulphide", Journal of Physical Chemistry Solids, vol. 39, pp. 11-18, Pergamon Press, Great Britain, 1978.

Kobayashi, Naoki, "Single quantum well photoluminescence in ZnSe/GaAs/AlGaAs grown by migration-enhanced epitaxy", Applied Physics Letters, vol. 55, No. 12, pp. 1235-1237, Sep. 18, 1989, © 1989 American Institute of Physics.

Krystek, M., "An Algorithm to Calculate Correlated Colour Temperature", Color Research and Application, vol. 10, pp. 38-40, © 1985 by John Wiley & Sons, Inc.

Litz et al., "Epitaxy of Zn1-xMgxSeyTe1-y on (100) InAs", Journals of Crystal Growth, vol. 159, pp. 54-57, 1999.

Odnoblyudov, V.A. and Tu, C. W., "Gas-source molecular-beam eptitaxial growth of Ga(In)NP on GaP(100) substrates for yellow-amber light-emitting devices", Journal of Vacuum Science and Technology B, vol. 23, No. 3, pp. 1317-1319, May/Jun. 2005, © 2005 American Vacuum Society.

Official Journal of the European Union, "Directive 2002/95/EC of the European Parliament and of the Council, of Jan. 27, 2003, on the restriction of the use of certain hazardous substances in electrical equipment", pp. L 37/19 to L 37/23, Feb. 2, 2003.

Official Journal of the European Union, "Commission Decision, of Aug. 18, 2005, amending Directive 2002/95/EC of the European Parliament and of the Council for the purpose of establishing the maximum concentration values for certain hazardous substances in electrical and electronic equipment", 2005/618/EC, p. L 214/65, Aug. 19, 2005.

Schubert, Fred E., Light Emitting Diodes, pp. 133-144, Second Edition, Universtity Press, Cambridge, U.K., © E. Fred Schubert, 2006.

Schubert, Fred E., Light Emitting Diodes, pp. 209-211, Second Edition, Universtity Press, Cambridge, U.K., © E. Fred Schubert, 2006.

Search Report for International Application No. PCT/US2010/033379, 4 pages, Date of Mailing Jan. 9, 2010.

Sethi, B.R. and Mather P. C., "Effect of Heavy Doping of ZnSe Crystals with Indium in Creating Compensating Acceptors", Physica Status Solidi. (a), pp. 717-721, 1978.

Takashima et al., "Proposal of a novel BeZnSeTe quaternary for II-VI middle range visible light emitting devices on InP substrates", Physica Status Solidi (b), vol. 241, No. 3, pp. 747-750, © 2004 Wiley-VCH.

Written Opinion for International Application No. PCT/US2010/033379, 8 pages, Date of Mailing Jan. 9, 2010.

Zeng et al., "Red-green-blue photopumped lasing from ZnCdMgSe/ZnCdSe quantum well laser structures grown on Inp", Applied Physics Letters, vol. 72, No. 24, pp. 3136-3138, Jun. 15, 1998, © 1998 American Institute of Physics.

* cited by examiner

RE-EMITTING SEMICONDUCTOR CARRIER DEVICES FOR USE WITH LEDS AND METHODS OF MANUFACTURE

CROSS REFERENCE TO RELATED APPLICATIONS

This application is a national stage filing under 35 U.S.C. 371 of PCT/US2010/033379, filed on May 3, 2010, which claims priority to U.S. Provisional Application No. 61/175,636, filed on May 5, 2009, the disclosure of which is incorporated by reference in its/their entirety herein.

RELATED APPLICATIONS

This application is related to the following U.S. Patent Applications, which are incorporated by reference: U.S. Application No. 61/175,640, "Re-Emitting Semiconductor Construction With Enhanced Extraction Efficiency", and U.S. Application No. 61/175,632, "Semiconductor Devices Grown on Indium-Containing Substrates Utilizing Indium Depletion Mechanisms".

FIELD OF THE INVENTION

This invention relates generally to solid state semiconductor light sources and related devices, systems, and methods.

BACKGROUND

A wide variety of semiconductor devices, and methods of making semiconductor devices, are known. Some of these devices are designed to emit light, such as visible or near-visible (e.g. ultraviolet or near infrared) light. Examples include light emitting diodes (LEDs) and laser diodes. Another example is a re-emitting semiconductor construction (RSC).

Unlike an LED, an RSC does not require an electrical drive current from an external electronic circuit in order to emit light. Instead, the RSC generates electron-hole pairs by absorption of light at a first wavelength $\lambda_1$ in an active region of the RSC. These electrons and holes then recombine in potential wells in the active region to emit light at a second wavelength $\lambda_2$ different from the first wavelength $\lambda_1$, and optionally at still other wavelengths $\lambda_2$, $\lambda_3$, and so forth depending on the number of potential wells and their design features. The initiating radiation or "pump light" at the first wavelength $\lambda_1$ is typically provided by a blue or ultraviolet emitting LED coupled to the RSC. Exemplary RSC devices, methods of their construction, and related devices and methods can be found in, e.g., U.S. Pat. No. 7,402,831 (Miller et al.), U.S. Patent Application Publications US 2007/0284565 (Leatherdale et al.) and US 2007/0290190 (Haase et al.), PCT Publication WO 2009/048704 (Kelley et al.), and pending U.S. Application Ser. No. 61/075,918, "Semiconductor Light Converting Construction", filed Jun. 26, 2008, all of which are incorporated herein by reference.

When reference is made herein to a light at a particular wavelength, the reader will understand that reference is being made to light having a spectrum whose peak wavelength is at the particular wavelength.

A vertical cavity surface emitting laser (VCSEL), which can be considered to be a type of RSC, is another example of a semiconductor device designed to emit light. The VCSEL converts at least a portion of a first wavelength light emitted by a pump light source, such as a III-V based pump light source that includes nitrogen, to at least a partially coherent light at a second wavelength. The VCSEL includes first and second mirrors that form an optical cavity for light at the second wavelength. The first mirror is substantially reflective at the second wavelength and includes a first multilayer stack. The second mirror is substantially transmissive at the first wavelength and partially reflective and partially transmissive at the second wavelength. The second mirror includes a second multilayer stack. The VCSEL further includes a semiconductor multilayer stack that is disposed between the first and second mirrors and converts at least a portion of the first wavelength light to the second wavelength light. The semiconductor multilayer stack includes a quantum well that includes a Cd(Mg)ZnSe alloy. Reference is made to pending U.S. Patent Application Ser. No. 61/094,270, "Diode-Pumped Light Source", filed Sep. 4, 2008, incorporated herein by reference.

DISCUSSION

The RSC may typically be fabricated, and combined with an LED, using the process outlined in the flow chart of FIG. 1 and depicted in the schematic side views of FIGS. 2a-2f. In the process, the RSC is fabricated in wafer form by growing a series or stack of semiconductor layers 210, which form the RSC, atop a semiconductor substrate 212 in wafer form using epitaxial growth techniques. The RSC wafer 214 so fabricated is then attached to an LED wafer 216 that has been processed to include LED devices. In the attachment procedure, the semiconductor stack 210 forming the RSC is oriented towards the LED wafer 216 and the semiconductor substrate 212 is oriented away from the LED wafer. Because the semiconductor substrate 212 is typically opaque to visible and near-visible light, it is removed from the construction by etching, which exposes the RSC 210 and leaves the bond between the RSC 210 and the LED wafer 216 intact. In some cases, at least some of the exposed surface of the RSC 210 is provided with surface texture (not shown in FIG. 1 or 2) to enhance the extraction efficiency of the long wavelength light generated within the RSC. The resulting wafer 218 is then subdivided or cut, for example using a wafer saw, to produce individual LED/RSC devices 220.

BRIEF SUMMARY

The methodology of FIGS. 1-2 has several disadvantages associated with it. Some of these involve practical commerce-related considerations. For example, if the LED and the RSC are manufactured by different entities, then process steps that occur after attachment of the RSC wafer to the LED wafer—such as the substrate removal step and the surface texturing step—from a practical standpoint may need to be carried out by the LED manufacturer. This is inefficient and/or undesirable to the extent that these process steps are directed to the RSC, yet are carried out by the entity (the LED manufacturer) that is probably least familiar with the RSC and least in control of its design details. Furthermore, the additional process steps may be undesirable for the LED manufacturer to perform for reasons of increased manufacturing time, undesirable processing byproducts, equipment or facility limitations, yield considerations, and so forth.

The present application therefore discloses, inter alia, alternative methods of fabricating RSCs and of combining RSCs with electroluminescent devices such as LEDs, laser diodes, or the like. One such method of fabrication includes providing a semiconductor substrate, forming on a first side of the substrate a semiconductor layer stack, attaching a carrier window to the stack, and removing the substrate after the attaching step. The stack includes an active region adapted to convert light at a first wavelength $\lambda_1$ to visible light at a second wavelength $\lambda_2$, the active region including at least a first potential well. The attaching step is carried out such that the stack is disposed between the substrate and the carrier window, which is transparent to the second wavelength $\lambda_2$. The carrier window may also have a lateral dimension greater than that of the stack. The removal step is carried out so as to provide an RSC carrier device that includes the carrier window and the stack. The method may also include forming extraction features in the semiconductor layer stack before the attaching step, in which case the attaching step may include attaching the carrier window to the semiconductor stack proximate the extraction features.

RSC carrier devices made by this method, whether in wafer form or diced up into smaller platelet form, can if desired be attached to an LED wafer or LED die respectively, without the need for further processing to remove the RSC growth substrate since it is now absent from the RSC device. If the RSC carrier device is in platelet form, the user, such as an LED manufacturer, may utilize pick-and-place manufacturing technology, and may individually match characteristics of RSC platelets and LED dies, to obtain improved yield and performance of individual LED/RSC devices.

The present application also discloses re-emitting semiconductor construction (RSC) carrier devices for use with LEDs. Such devices may include a stack of semiconductor layers formed by epitaxial growth on a substrate, and a carrier window attached to the stack. The stack preferably is or includes an RSC, and is adapted to convert light at a first wavelength $\lambda_1$ to visible light at a second wavelength $\lambda_2$. The carrier window preferably substantially transmits light at the second wavelength $\lambda_2$. The stack is no longer supported by the growth substrate, and may include a first potential well and a first absorbing layer closely adjacent to and having a band gap energy greater than a transition energy of the first potential well.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

DETAILED DESCRIPTION OF ILLUSTRATIVE EMBODIMENTS

Figure 3:
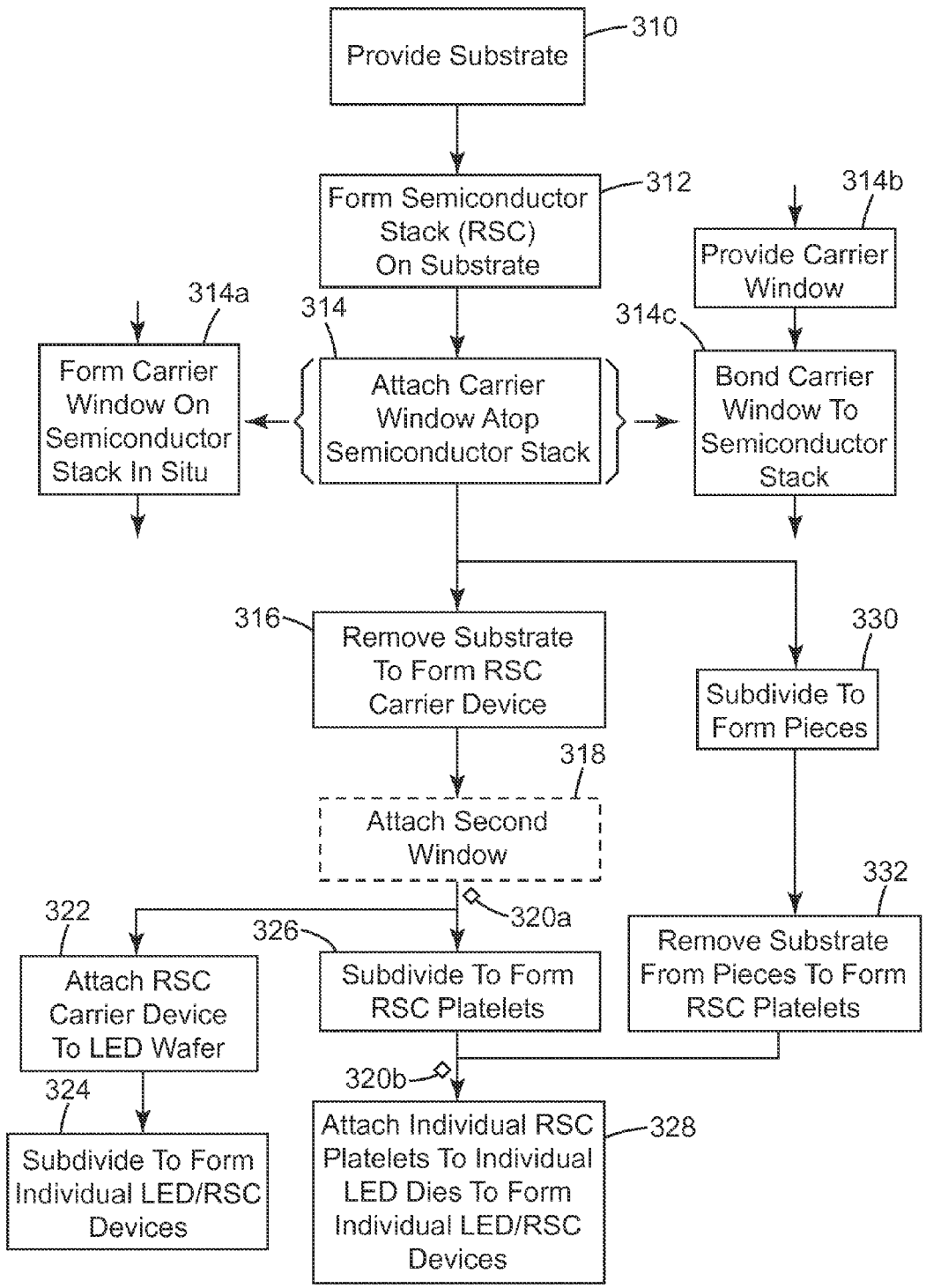
FIG. 3 is a flow chart depicting several alternative processes for fabricating RSC devices and combining them with LED devices.

Some alternative processes for fabricating RSC devices and combining them with LED devices are depicted in FIG. 3. Each of these processes is preferably compatible with a finished RSC device that can be attached to an LED device, whether in wafer form or in individual die form, without the need for further processing to remove the RSC growth substrate, since the growth substrate is preferably absent from the RSC device.

The processes begin by providing a suitable growth substrate at step 310. The growth substrate has properties that make it suitable for growing epitaxial device layers thereon in a suitable growth chamber. For example, the growth substrate desirably provides a clean substantially defect-free surface of a monocrystalline material that has at least an approximate lattice match to the crystal lattice of the semiconductor device layers to be grown. Typically, such a surface is provided by a thin semiconductor buffer layer that has been grown atop a thicker semiconductor base layer, but this is not necessarily required. An exemplary growth substrate is a thick base layer of monocrystalline indium phosphide (InP) on which a thin layer of gallium indium arsenide (GaInAs) has been grown, but other substrate embodiments are also contemplated. The substrate may comprise any suitable III-V semiconductor material. Alternatively, the substrate may comprise any suitable II-VI semiconductor material. The substrate may also comprise a semiconductor material whose crystal matrix incorporates indium. Preferably, but not necessarily, the substrate is in a relatively large wafer form to allow for a relatively large RSC device to be fabricated, from which a large number of smaller RSC devices can be obtained by subdividing the larger device e.g. by dicing with a wafer saw. Semiconductor wafers are generally thin, flat, disc-shaped articles having a diameter or similar lateral dimension of at least 1 inch, or at least 2 inches, or at least 3 inches, or at least 4 inches, but other sizes and shapes are also contemplated.

After step 310, a stack of semiconductor layers is formed atop the pristine growth surface of the growth substrate at step 312. (The term "atop" as used herein is not restricted to a particular orientation with respect to the gravitational field of the local environment, but simply refers to one element being disposed on another element, optionally with one or more intermediate elements disposed therebetween, unless otherwise indicated. Thus, a first element may be "atop" a second element even if the first element is disposed on a "bottom" surface of the second element, from the standpoint of gravity.) These layers, which may be formed using molecular beam epitaxy (MBE) or any other suitable technique, are formed in a chronological sequence, one atop the other, from a "starting" device layer on one side of the stack to an "ending" device layer on the opposite side of the stack. The terms "starting" layer and "ending" layer, and related terms such as "starting" surface and "ending" surface, are descriptive of the growth order of the device. Note that in cases where a first-grown semiconductor device layer is etched away at a later time for some design purpose, the second-grown semiconductor device layer is considered to be the starting device layer, and the outer surface of the second-grown layer is considered to be the starting surface of the device. Similarly, if a last-grown semiconductor device layer is etched away at a later time, the second-to-last-grown semiconductor device layer is considered to be the ending device layer, and the outer surface of this layer is considered to be the ending surface of the device.

The layers of the stack are engineered to form a re-emitting semiconductor construction (RSC) device as referenced above. The composition, morphology, and thickness of each individual layer is controlled by appropriate selection of source fluxes to be introduced into the growth chamber, and other process parameters such as time and temperature, as will be apparent to those skilled in the art of semiconductor device fabrication. Any of a wide variety of RSC layer designs can be fabricated, from very simple to complex.

Generally, the semiconductor stack forming the RSC includes at least one active region, in which at least one potential well and optionally at least one absorbing layer reside, and at least one inactive region. The active region is adapted to convert light at a first wavelength $\lambda_1$ to light at a second wavelength $\lambda_2$ different from the first wavelength $\lambda_1$. In the active region of the RSC, light at the first wavelength $\lambda_1$ is absorbed and generates electron-hole pairs. Electrons and holes recombine in the potential well(s) to emit light at the second wavelength $\lambda_2$. In exemplary embodiments, the second wavelength $\lambda_2$ is a visible wavelength, for example, a wavelength corresponding to green, yellow, amber, orange, or red light, and is longer than the first wavelength $\lambda_1$. In a finished device, the initiating radiation or "pump light" at the first wavelength $\lambda_1$ may be provided by an electroluminescent device emitting light at a shorter wavelength than $\lambda_2$. Typically, this is a blue, violet, or ultraviolet emitting LED coupled to the RSC, but other electroluminescent devices, such as laser diodes, can also be used. The active region of the RSC may have only one potential well or may include multiple potential wells. In the latter case, the multiple potential wells may be designed to emit light at the same wavelength, or they may be designed to emit light at different wavelengths. In the latter case, not only a second wavelength $\lambda_2$ but also a third wavelength $\lambda_3$ and optionally a fourth wavelength $\lambda_4$, and so forth, may be produced by the different potential wells. The composition of the absorbing layer(s) is selected to provide a band gap energy that will provide substantial absorption of light at the first wavelength $\lambda_1$. The thicknesses and arrangement of the absorbing layers relative to the potential well(s) can be engineered for optimal performance based on the absorption characteristics of the absorbing layers and the spectral distribution of the pump source at the first wavelength. The composition of the potential well layer(s) is selected to provide a transition energy less than that of the absorbing layer(s). In some cases it may be desirable to make a given potential well layer sufficiently thin so that quantization maintains the transition energy above the bulk band gap energy of the semiconductor material. Such a potential well can be regarded as a quantum well. In some cases the layer structure in the vicinity of the potential well may be designed such that one or more, or all, of the potential wells are not located within any pn junction.

The semiconductor stack forming the RSC may also include window layers on one side or on opposite sides of the active region. Such window layers may be grown with a composition whose band gap energy is greater than that of the absorption layer(s) and greater than the transition energy of the potential well(s) in the active region. One, some, or all such window layers may thus be made to be substantially transparent to light at the emitted wavelengths $\lambda_2$, $\lambda_3$, etc. If the band gap energy of these layer(s) is sufficiently high, it or they can also be made to be substantially transparent to pump light at the first wavelength $\lambda_1$.

Besides window layers and the layers making up the active region of the RSC, the semiconductor stack may also include other functional semiconductor layers or features. Examples include one or more graded composition layers, light filtering layers, reflecting layers, and anti-reflecting layers, for example. An example of a light filtering layer is a layer that absorbs substantially all of the short wavelength light supplied by the pump light source at the wavelength $\lambda_1$ not absorbed by the absorbing layer(s), but which highly transmits the re-emitted light originating from the potential well(s), which layer is sometimes referred to as a "cyan blocker". In a finished device, such a layer may be included on a side of the RSC opposite the side facing the pump light source, i.e., such that the active region and particularly the potential wells of the active region are disposed between the pump light source and the light filtering layer/cyan blocker. The absorptive characteristics of such a light filtering layer can be achieved by appropriate adjustment of its band gap energy. Further information in this regard can be found in pending U.S. Application Ser. No. 61/075,918, referenced above.

The step 312 may also include forming extraction features in the semiconductor stack, for example in the ending surface of the stack, to discourage trapping of light by total internal reflection inside the semiconductor stack, and to enhance extraction efficiency. Exemplary extraction features are disclosed in commonly filed U.S. Application 61/175,640, "Re-Emitting Semiconductor Construction With Enhanced Extraction Efficiency".

In exemplary embodiments, the constituent layers of the semiconductor stack grown in step 312 are composed of II-VI semiconductor materials, such as cadmium zinc selenide (CdZnSe) or cadmium magnesium zinc selenide (CdMgZnSe). The band gap energies of these materials can be tailored by suitable adjustment of the relative proportions of the constituent elements in the crystal matrix, as described for example in U.S. Pat. No. 7,402,831 (Miller et al.). Where appropriate, the semiconductors can also be doped by any suitable method or by inclusion of any suitable dopant. For example, CdMgZnSe can be n-doped by inclusion of chlorine (Cl) atoms. Such doping can be used to promote radiative recombination of electron-hole pairs relative to recombination mechanisms that may be defect-related and do not contribute to radiative emission. The constituent layers of the semiconductor stack grown in step 312 may alternatively be composed of any other suitable semiconductor material, including but not limited to suitable III-V semiconductor materials. Layers composed of materials that are not semiconductors can however be applied to an RSC stack. For example, the RSC may have a transparent inorganic coating applied to it, such as silica to serve as an adhesion-promoting layer for use in bonding to the carrier window, or to protect the semiconductor layers from mechanical damage during handling. The RSC may also have other non-semiconductor coatings applied to it, providing anti-reflection, spectral filtering, or optical absorption or reflection functions. Furthermore, layers of the semiconductor stack, or layers deposited on the semiconductor stack, can be designed to serve as reflectors, thereby providing optical feedback and allowing laser operation of the RSC.

Generally, the finished semiconductor stack which forms the RSC (as well as its constituent layers including any semiconductor window layers, if present) is, considered by itself in isolation, extremely thin and fragile from a macroscopic handling point of view. For example, a typical RSC may have an overall thickness, from its "starting" surface to its "ending" surface, of less than 10 microns, or less than 5 microns. If the semiconductor stack were separated from its growth substrate at the end of step 312, it would be extremely difficult to handle and manipulate in subsequent process steps without breaking, or without producing unacceptable defects in the layers, particularly if its transverse dimensions are on the order of 1 inch, 2 inches, 3 inches, or 4 inches or more, but even if its transverse dimension is one the order of 1 millimeter or a substantial fraction thereof, e.g., several hundred microns.

Therefore, after step 312, a carrier window is attached to the semiconductor stack in step 314. The carrier window attaches to a side of the stack opposite the growth substrate. Stated differently, the growth substrate is disposed at the "starting" layer of the stack, or at the "starting surface" of the stack, and the carrier window is disposed at an "ending" layer or "ending surface" of the stack. The carrier window preferably provides certain key mechanical characteristics and certain key optical characteristics.

With regard to mechanical characteristics, the carrier window preferably has a thickness and material properties, e.g. elastic modulus and hardness, adequate to permit handling of the carrier window, whether manually by a human operator or robotically by automated processing equipment, without substantial breakage of the carrier window. In cases where the carrier window is or becomes attached to the semiconductor stack, the carrier window preferably also has mechanical properties adequate to permit handling of the combined carrier window/semiconductor stack, in the absence of the growth substrate, without breakage of the window and/or stack, and without producing unacceptable defects in the layers of the stack, which may result for example from excessive bending or flexure. The carrier window thus preferably provides sufficient mechanical support for itself, and for itself in combination with the semiconductor stack, to allow for normal handling during device fabrication. Note that the amount of mechanical support required depends to some extent on the transverse dimensions of the carrier window and/or semiconductor stack. In general, a greater thickness and/or an increased elastic modulus may be required for large transverse dimensions, e.g., at least 1, 2, 3, or 4 inches or more, compared to smaller transverse dimensions, e.g., less than 1 inch, or less than 10, 5, or 1 millimeter, for example. For typical wafer-sized parts, which may have transverse dimensions of 1, 2, or 3 inches or more, a thickness of at least 100, or 300, or 500 microns or more may be adequate for typical candidate materials. For parts that are generally smaller, such as the platelets described below, which may have transverse dimensions of less than 1 inch, or less than 10, 5, or 1 millimeter, for example, a thickness of at least 10, or 25, 50, or 100 microns may be adequate.

With regard to optical characteristics, the carrier window preferably substantially transmits light that is re-emitted by the potential well(s) of the semiconductor stack, referred to above as light at the second wavelength $\lambda_2$. If the stack includes multiple potential wells and if they produce light at other re-emitted wavelengths, e.g., a third wavelength $\lambda_3$, a fourth wavelength $\lambda_4$, and so forth, light at these other wavelengths is also preferably highly transmitted by the carrier window. The carrier window may or may not substantially transmit pump light at the first wavelength $\lambda_1$, depending on the intended use of the RSC and the design of the LED/RSC combination. In designs wherein the RSC/carrier window combination is intended to be oriented such that the carrier window faces towards the pump light source, the carrier window desirably has a high transmission for pump light at the first wavelength $\lambda_1$ so that the pump light can efficiently reach the active region of the RSC. In designs wherein the RSC/carrier window combination is intended to be oriented such that the carrier window faces away from the pump light source, the carrier window may or may not substantially transmit the pump light. In some of these designs, it is undesirable for pump light to be transmitted through the RSC. In those designs, the RSC typically includes a cyan blocker layer as described above, and the carrier window need not have a high transmission of the pump light, but may instead substantially absorb or otherwise block the pump light. In other designs, it is desirable for the RSC to transmit some of the pump light so that it mixes with re-emitted light, e.g. to provide white light output, and in those cases the carrier window preferably substantially transmits the pump light.

The carrier window may have other desirable characteristics or features. For example, it may have optical filtering properties to suppress emission of residual pump light, to control polarization, or to shape the emission spectrum. It preferably resists etchants that may be used in removal of the growth substrate, discussed further below. It preferably has an adequate match of coefficient of thermal expansion (CTE) to that of the semiconductor stack. It may desirably have a relatively high thermal conductivity, e.g., 100-700 W/m*K, such that it acts as a heat sink to minimize heating of the RSC during operation. If the RSC is intended for use in an encapsulated LED, it may be desirable to substantially match the refractive index of the carrier window to that of the encapsulant material. The carrier window may also be provided with prefabricated vias for electrical access to the pump LED, or with prefabricated trenches or "dicing streets" for eventual division into platelets. The carrier window may also be provided with features performing additional optical functions, such as light extraction features, anti-reflection textures or coatings, polarizing coatings, wavelength-selective (dichroic) coatings, reflective coatings, refractive lenses, diffractive elements, frustums, photonic crystals, patterned absorbing layers, or other elements for controlling the angular distribution of the emitted light. Some of these features are discussed further below and/or in patent-related documents cited herein.

Exemplary materials for use as the carrier window include but are not limited to: fused silica; glasses of various types, including spin-on glasses and multi-component glasses; polymers; semiconductors; and dielectric crystalline materials such as sapphire, diamond, silicon carbide, quartz, and alumina.

Referring again to FIG. 3, the carrier window attachment 314 can be carried out in at least two ways. In one approach, represented by step 314a, the carrier window is formed in situ on the semiconductor stack. In another approach, represented by steps 314b and 314c, the carrier window is fabricated separately from the semiconductor stack, and is then bonded to the stack e.g. with a light transmissive bonding material.

In the in situ approach of step 314a, the carrier window is formed directly on the semiconductor stack. For example, the carrier window may be formed by applying and curing a polymer resin on the ending surface of the stack, or by depositing a thick layer of inorganic material such as silica on the stack.

In the approach of steps 314*b*, 314*c*, the carrier window is fabricated separately from the stack and is then bonded thereto. In some cases, the carrier window may be bonded to the stack with a bonding material such as a transparent adhesive. Such a material may be applied, in liquid form for example, to the surface of the carrier window, to the surface of the stack, or to both, after which the two elements can be placed together with the bonding material sandwiched therebetween, followed by curing or hardening of the bonding material. Suitable adhesives are preferably substantially transparent to at least the re-emitted light from the stack, and stable under long-term illumination with the re-emitted light. They also preferably have adequate long-term stability at the operating temperature of the LED. They may be thermally or optically cured, since optical curing can be performed through the transparent carrier window. The adhesive preferably minimizes thermal stress on the semiconductor stack, e.g. by exhibiting a minimal CTE mismatch relative to the stack and/or the carrier window, or by having a low elastic modulus, or both. High thermal conductivity may also be desirable, to allow the carrier window to act effectively as a heat sink or heat spreader. Also, the composition of the adhesive is preferably compatible with easy removal from vias, if present in the carrier window, and compatible with easy subdivision (e.g. dicing) of wafer-based components into smaller platelets or pieces. If the semiconductor layer has light extraction features formed in its ending surface, which faces towards the carrier window, it may be advantageous for the adhesive to have a lower refractive index than the carrier window in order prevent light trapping via total internal reflection at the interface between the adhesive layer and the carrier window. Examples of candidate adhesives include thermal- or UV-cured optical adhesives such as acrylates, epoxies, silicones, or benzocyclobutene (BCB), or inorganic adhesives such as silanes, sol gels, silsesquioxane, or other metal-alkoxide materials. It may be helpful to apply an adhesion-promoting surface treatment, or an adhesion-promoting layer, to the semiconductor stack and/or to the carrier window in order to achieve good bond reliability.

In some cases, the carrier window can be bonded to the stack using solid-state bonding processes, such as wafer bonding. For example, the semiconductor stack can be bonded to a glass carrier window using plasma-activated wafer bonding. Alternatively, a thin adhesion promotion layer of silica, for example, can be deposited on both surfaces to be bonded, the coated surfaces can then be polished to a high degree of smoothness and planarity, the polished surfaces activated using a plasma or wet chemical process for example, and then the stack can be allowed to spontaneously bond to the carrier window. Heat treatments can be used to further increase bond strength. Further examples of suitable wafer bonding processes are given in U.S. Pat. No. 6,902,987 (Tong et al.).

In some cases it may be desirable for the carrier window to be coextensive with the growth substrate and semiconductor stack at the time of attachment, i.e., having the same lateral dimensions and shape. In other cases, the carrier window may be physically larger or smaller in lateral dimension than the stack, and may have a different (plan view) shape than the stack. For example, a square or rectangular-shaped microscope slide cover may be used as carrier window for a substantially circular-shaped growth substrate/stack, and the square or rectangle may be somewhat larger than or smaller than the growth substrate/stack.

After the carrier window is in place and securely attached to the semiconductor stack, the growth substrate is removed from the construction in step 316. This may be done by any suitable process, including but not limited to chemical etching. After substrate removal, the resulting structure, which includes the carrier window attached to and supporting the semiconductor stack, but which no longer includes the growth substrate used to form the stack, is referred to as an RSC carrier device because the RSC is being supported or carried by the carrier window.

After the substrate removal, a second window may be attached to the RSC carrier device in an optional step 318. The second window may be attached to a side of the semiconductor stack opposite the carrier window, i.e., at the starting surface of the stack where the growth substrate had formerly been. The second window is preferably substantially transparent to the light re-emitted by the RSC, and may or may not be transparent to pump light from the LED depending on design details of the LED/RSC system, such as whether the second window is intended to be disposed between the pump light source and the RSC. In most cases the second window is highly transparent to the pump light, but in some cases the second window may absorb or otherwise substantially block the pump light.

The second window may be attached in any of the ways described in connection with the carrier window, e.g., either formed in situ on the RSC carrier device or by bonding a separately manufactured window article to the RSC carrier device. The second window may be or comprise a relatively thick layer of a resilient, impermeable material. It may serve to protect the semiconductor stack from mechanical damage during handling, or from degradation from environmental effects. Such a second window may be produced, for example, by bonding a sheet of material, such as a glass superstrate, to the RSC carrier device after removal from the growth substrate, or by casting of a polymer material onto the exposed side of the RSC (opposite the carrier window), or by depositing a thick layer of inorganic material on the exposed side of the RSC. In the resulting structure, still referred to as an RSC carrier device, the RSC is sandwiched between two protective layers—the carrier window, and the second window. If an adhesive or similar material is used to bond the second window to the semiconductor stack, it preferably has many of the same characteristics discussed above in connection with the adhesive used with the carrier window. For example, the adhesive may desirably be transparent to the re-emitted light and pump light, and stable under long-term illumination with both the pump light and the re-emitted light. Further, it may be desirable for the adhesive to be substantially index matched to the material of the second window.

The diamond symbol 320*a* beneath box 318 indicates that after step 318 (or after step 316, if step 318 is omitted), an RSC manufacturer may choose to sell the RSC carrier device and ship the device in that form to the LED manufacturer, assuming that the RSC and LED devices are manufactured by different entities.

After step 318 or 316, a separately manufactured LED, typically in the form of an LED wafer with a plurality of LEDs formed therein, is provided, and the RSC carrier device, which may also be in wafer form, is attached to the LED wafer in step 322. Attachment may be carried out using a suitable bonding material such as an adhesive similar to those already discussed, or by any other suitable means. Solid-state bonding processes, such as wafer bonding as mentioned above, may also be used. If an adhesive or similar bonding material is used, it may be pre-applied to the RSC carrier device (whether in wafer form or in platelet form as described further below) at the time of pick-and-place bonding to the pump LED, and thus may not be included as part of the RSC carrier device. Alternatively, it may be advantageous in some cases to have a pre-applied adhesive layer supplied on the RSC carrier device. The adhesive is preferably transparent to the pump light, and is stable under long term illumination with the pump light and the re-emitted light. It preferably also has adequate long-term stability at the LED operating temperature. It may be thermally cured, since optical curing through the LED or through the RSC may be problematic. In some cases it may be possible to cure a photocurable adhesive by activating the LED. The adhesive also preferably has characteristics that minimize thermal stress on the semiconductor stack, e.g. by having minimal thermal expansion mismatch, or by having a low elastic modulus. High thermal conductivity is also desirable to enable the LED to act as a heat sink. Also, the adhesive may be chosen to facilitate its easy removal from bond pads on the pump LED. Examples of candidate adhesives include silicones, BCB, etc.

Figure 1:
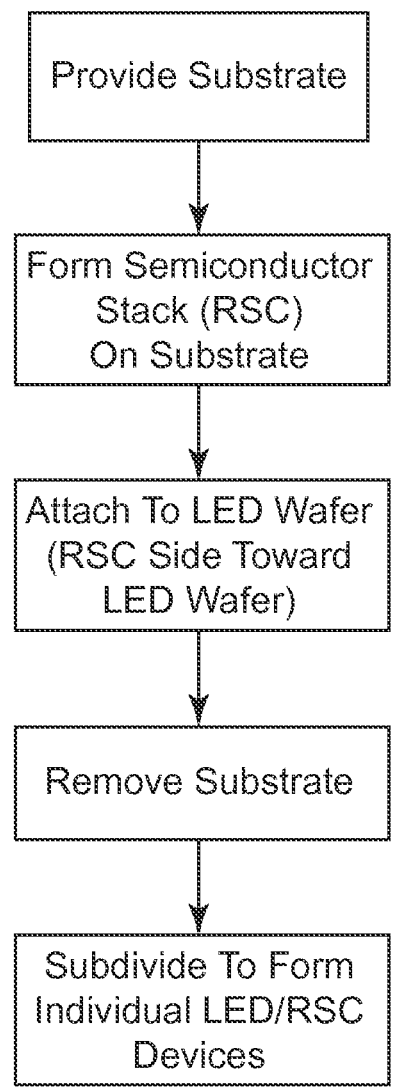
FIG. 1 is a flow chart of a process for fabricating RSC devices and combining them with LED devices.
Figure 2A:
FIGS. 2a-f are schematic side views of RSC devices, LED devices, and LED/RSC devices as implemented in the process of FIG. 1.
Figure 2B:
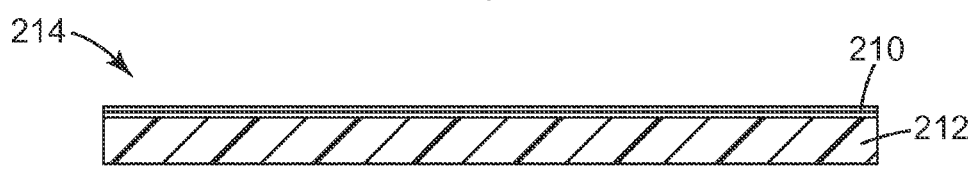
Figure 2C:
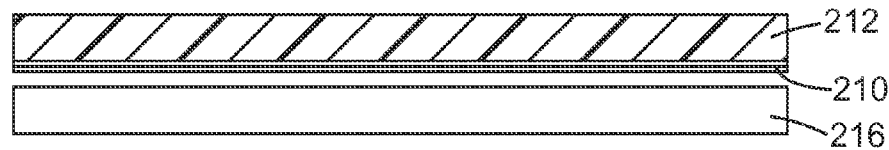
Figure 2D:
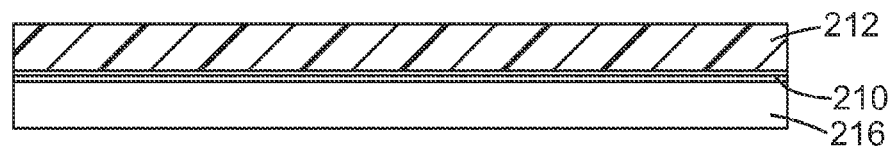
Figure 2E:
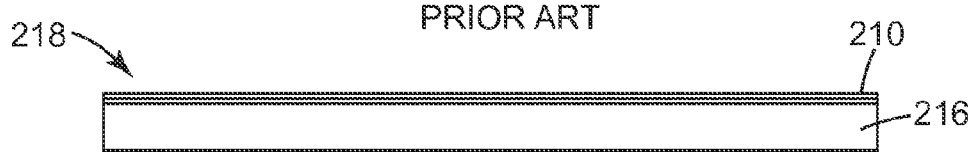
Figure 2F:
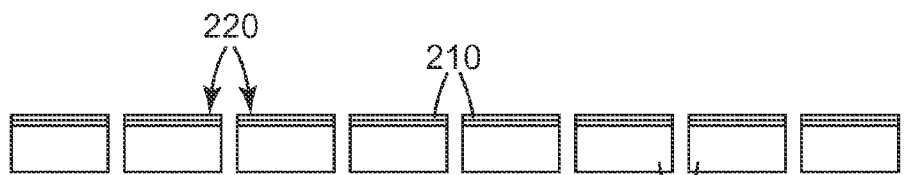

The RSC carrier device can be attached to the LED wafer in one of two configurations, which are characterized by which outer surface of the RSC faces towards the pump light source, such surface referred to herein as the "illumination surface" of the RSC. In one configuration, referred to herein as the "standard orientation", the illumination surface is selected to be the ending surface of the RSC, e.g., the outer surface of the last-grown RSC device layer. The process described in connection with FIGS. 1 and 2 is limited to this configuration. In the other configuration, referred to herein as the "inverted orientation", the illumination surface is selected to be the starting surface of the RSC, e.g., the outer surface of the first-grown RSC device layer. Note that the process of FIG. 3 is compatible with both the standard orientation and the inverted orientation, since the growth substrate has been removed before attachment to the LED. Thus, the RSC carrier device resulting from step 316 or 318 can be attached to the LED wafer according to either the standard orientation or the inverted orientation in step 322.

Thereafter, the typically physically large LED/RSC device in wafer form is subdivided in step 324, e.g. by dicing with a wafer saw, to form a plurality of individual LED/RSC devices, each of which incorporates a piece or "platelet" of the RSC carrier device manufactured using steps 310-318.

In a variation of the above-described method, the RSC carrier device manufactured using steps 310-318 is subdivided into pieces or platelets in step 326 before attachment to the LED, and optionally before sale and/or shipment from an RSC manufacturer to an LED manufacturer as indicated by diamond symbol 320b. After the subdividing, the individual RSC platelets are attached to individual LED die in step 328 to form the individual LED/RSC devices. A bonding material such as an adhesive or the like can be used for attachment, as described in connection with step 322.

In another variation of the above-described methods, the construction produced by step 314, which includes the RSC and the carrier window but also includes the growth substrate, can be subdivided into individual pieces in step 330, such as by dicing with a wafer saw. The piece of growth substrate included in each of the individual pieces can then be removed in step 332 by chemical etching or by any other suitable technique, without damaging the piece of RSC or carrier window which remain attached to each other. The result of the substrate removal is once again an RSC carrier device, but now already in the form of a plurality of small platelets.

Having described now in connection with FIG. 3 alternative methods of manufacturing RSC devices compared to that set forth in FIG. 1, we turn to FIGS. 4-12, which depict representative RSC devices or components thereof that may enhance the reader's understanding of the disclosed methods.

Figure 4:
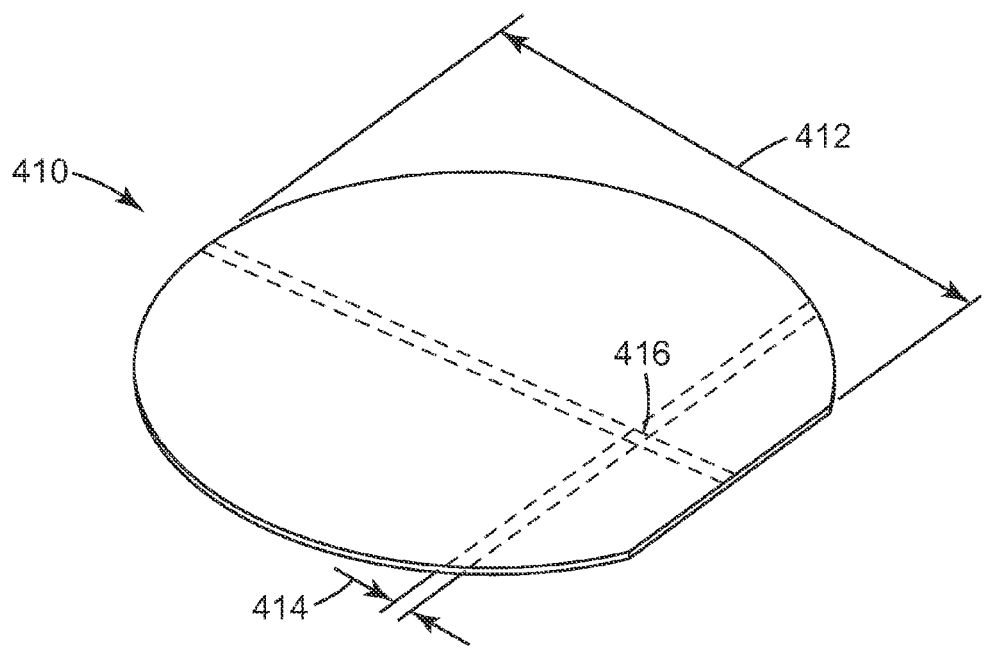
FIG. 4 is a perspective view of an RSC carrier device in wafer form, also depicting a platelet that may be obtained by subdividing the wafer.

In FIG. 4, we see a perspective view of an RSC carrier device 410 in wafer form, also depicting a platelet 416 that may be obtained by subdividing the wafer along the illustrated saw lines. The wafer has a characteristic lateral dimension 412, which may for example be at least 1, 2, 3, or 4 inches. The platelet 416 has a characteristic lateral dimension 414, which may be less than 1 inch, or less than 10, 5, or 1 millimeter, for example.

Figure 5:
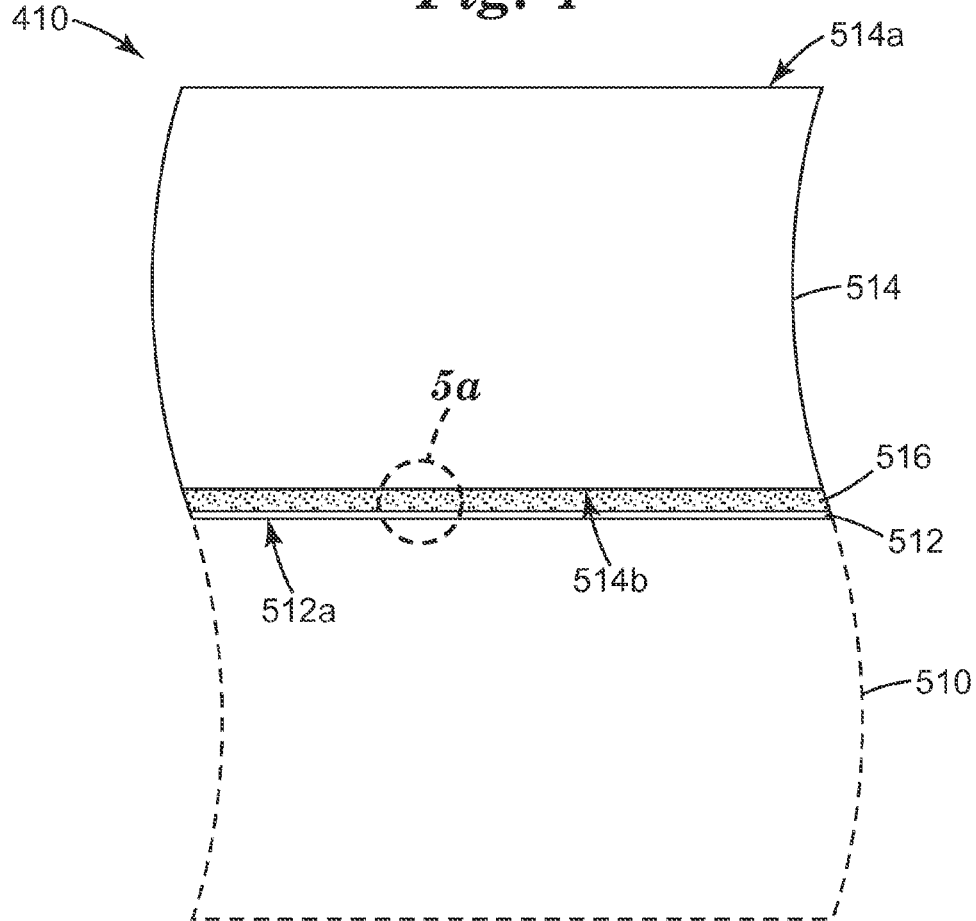
FIG. 5 is a schematic cross-sectional view of a portion of the RSC carrier device of FIG. 4.

In FIG. 5, we see a schematic cross-sectional view of a portion of the RSC carrier device 410 of FIG. 4. This view reveals the various major components of the device. The device includes a relatively thick carrier window 514 attached to a relatively thin semiconductor layer stack 512 (which forms an RSC) via a bonding layer 516. The carrier window 514 has opposed major surfaces 514a, 514b as shown. Either one of these surfaces, or both surfaces, can be provided with suitable extraction features to reduce light entrapment by total internal reflection and to enhance light extraction efficiency. Another thick layer 510 is shown in phantom, because it represents the semiconductor growth substrate on which the stack 512 was formed, but which has been subsequently removed e.g. as in step 316 of FIG. 3.

Figure 5A:
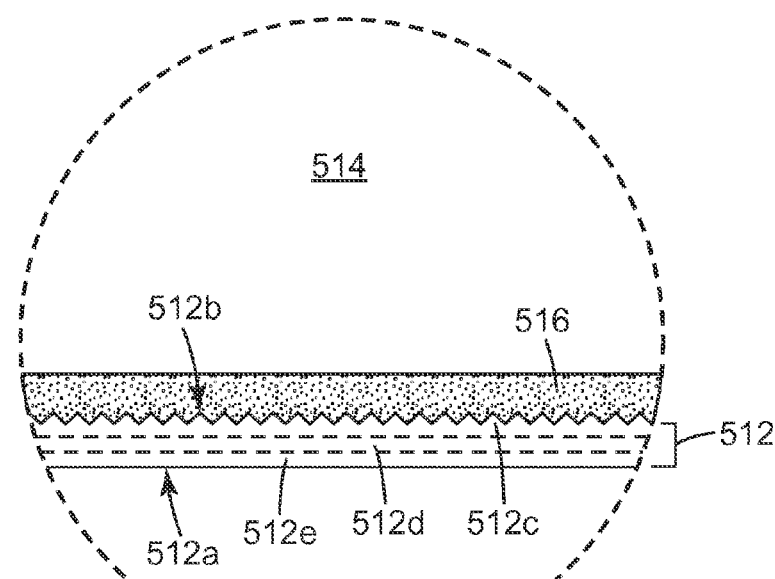
FIG. 5a is a magnified view of a portion of the device of FIG. 5.

In FIG. 5a we see a magnified schematic view of a portion of the RSC carrier device 410 of FIGS. 4 and 5. In this view, different portions of the semiconductor stack 512 are identified. In particular, the stack 512 includes an active region 512d sandwiched between two inactive regions 512c, 512e. The stack 512 also has a starting surface 512a and an ending surface 512b, the starting surface being disposed nearest the growth substrate 510 and the ending surface being farthest from the growth substrate. The ending surface 512b is shown as having extraction features formed therein, but starting surface 512a may also be made to have such features. Alternatively, in some cases neither of the surfaces 512a, 512b may be provided with extraction features.

Figure 6:
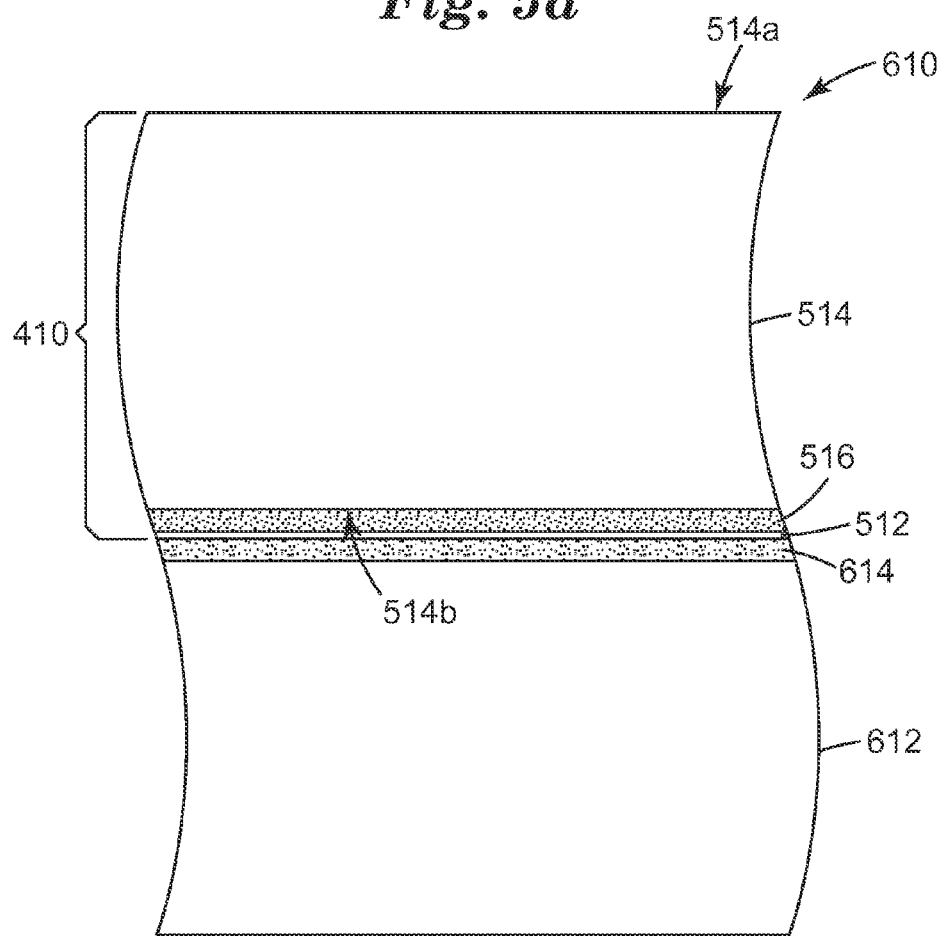
FIG. 6 a schematic cross-sectional view of the RSC carrier device of FIGS. 4 and 5 in combination with an LED.

In FIG. 6 we see a schematic cross-sectional view of a portion of the RSC carrier device 410 of FIGS. 4 and 5 in combination with an LED 612. The RSC carrier device 410 attaches to the LED 612 with a bonding layer 614, which may have the same composition or a different composition relative to bonding layer 516. Note that the resulting LED/RSC device uses the "inverted orientation" configuration, because the illumination surface of the RSC is the starting surface 512a of the RSC, i.e., the exterior surface of the first-grown RSC device layer.

Figure 7:
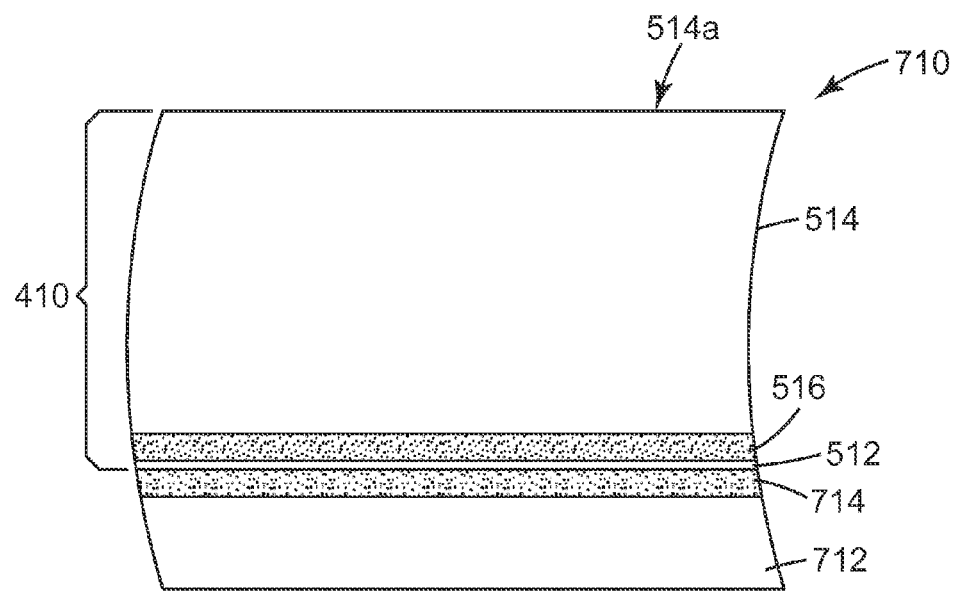
FIG. 7 is a schematic cross-sectional view of a portion of an alternative RSC carrier device that incorporates the RSC carrier device of FIGS. 4 and 5.

In FIG. 7 we see a schematic cross-sectional view of a portion of an alternative RSC carrier device 710 that incorporates the RSC carrier device 410 of FIGS. 4 and 5. The RSC carrier device 710 is constructed by attaching a second window layer 712 to the device 410 with a bonding layer 714. Thus, the semiconductor stack 512 is sandwiched between the carrier window 514 and the second window 712. Although the window 712 is illustrated as being thinner than the carrier window 514, the second window may if desired be the same thickness as the carrier window, or may be thicker than the carrier window. The bonding layer 714 may have the same composition or a different composition relative to bonding layer 516.

Figure 8:
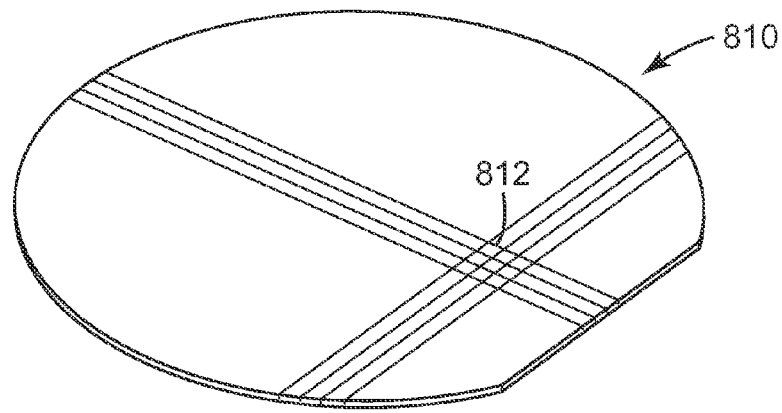
FIG. 8 is a perspective view of an RSC carrier device in wafer form with prefabricated trenches formed therein to facilitate subdivision into platelets.
Figure 9:
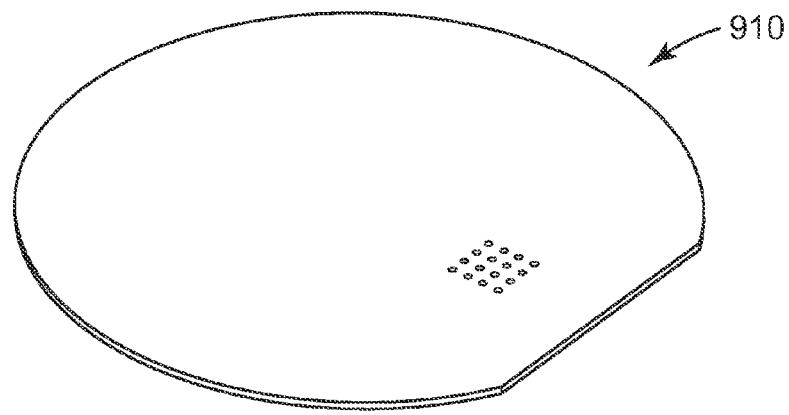
FIG. 9 is a perspective view of an RSC carrier device in wafer form with vias formed therein.

In FIG. 8 we see a perspective view of an RSC carrier device 810 in wafer form with some prefabricated trenches formed therein to facilitate subdivision into platelets 812. In FIG. 9 we see a perspective view of a similar RSC carrier device 910 in wafer form but with an array of vias formed therein.

Figure 10:
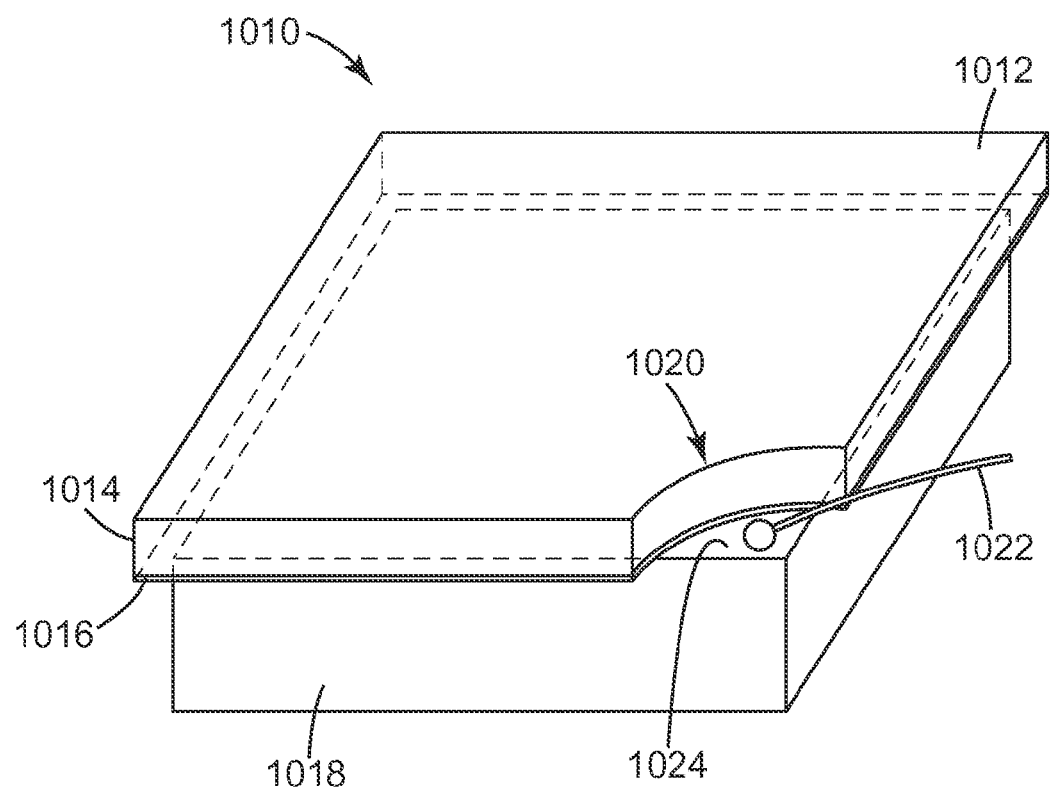
FIG. 10 is a perspective view of an LED/RSC device.

In FIG. 10 we see a perspective view of an LED/RSC device 1010. The device 1010 was made by attaching a platelet of an RSC carrier device 1012 to an LED die 1018. The RSC carrier device 1012 includes a carrier window 1014 and a semiconductor layer stack 1016 that includes an RSC. The relative position of the LED, carrier window, and RSC indicates that the device 1010 uses the "inverted orientation" configuration, because the illumination surface of the RSC is the starting surface of the RSC. A via 1020, or a remnant of a via, in the RSC carrier device 1012 provides access to a portion of an output surface of the LED 1018. More precisely, the via 1020 allows a bonding wire 1022 to make contact with an electrical contact pad 1024 on the output surface of the LED. Except for the via, the RSC carrier device 1012 is "oversized", i.e., somewhat larger in lateral dimension, than the LED die. Oversizing the RSC platelet relative to the LED is beneficial because small shifts in the placement of the RSC platelet, which may occur within a tolerance band for any given LED/RSC device, will not expose portions of the LED output surface and thus will not introduce unwanted pump light into the light output of the device.

Figure 11A:
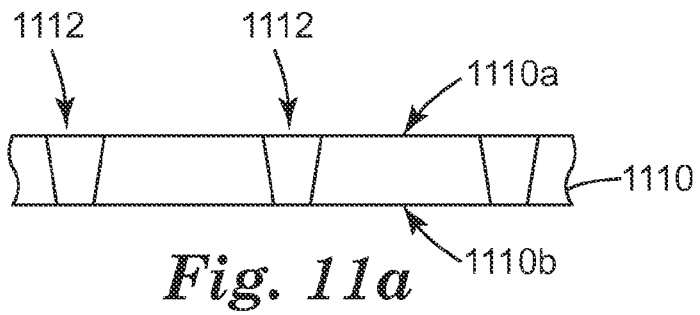
FIGS. 11a-e are schematic side views of an RSC carrier device or components thereof in different stages of manufacture, wherein a carrier window used in the construction includes through vias.
Figure 11B:
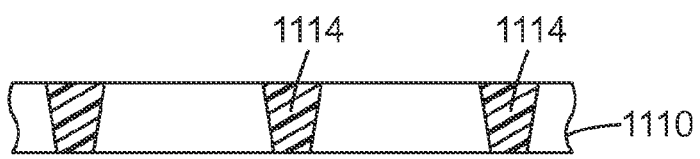
Figure 11C:
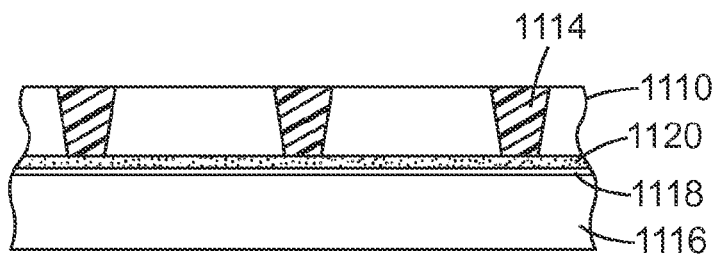
Figure 11D:
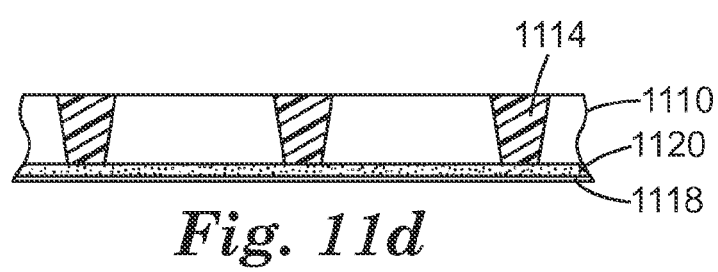
Figure 11E:
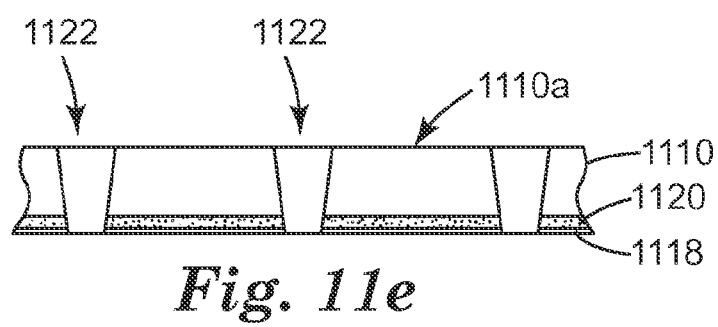

Turning now to FIGS. 11a-e, these figures show schematic side views of an RSC carrier device or components thereof in different stages of manufacture, wherein a carrier window 1110 used in the construction includes "through vias" 1112. FIG. 11a shows the carrier window 1110 with "through vias" 1112, each "through via" extending through the entire thickness of the carrier window from a first major surface 1110a thereof to an opposed second major surface 1110b. In preparation for bonding the carrier window to the RSC, and to prevent bonding material from flowing out of the bond area through the "through vias", the vias 1112 are filled with a wax or another suitable filler material 1114 (see FIG. 11b). After the filler material hardens, a growth substrate 1116 with an RSC 1118 grown thereon is provided, and an adhesive or other bonding material 1120 is applied between the carrier window and the RSC, and allowed to cure (see FIG. 11c). After the bond is secure, the growth substrate 1116 is removed with an etchant or by any other suitable means, producing an RSC carrier device (see FIG. 11d). The filler material 1114 is then removed via thermal and/or chemical processes, and the "through vias" 1112 are extended through the layer of bonding material 1120 and through the RSC 1118 with a suitable wet etch or other means (see FIG. 11e). Thereafter, the construction can be subdivided into platelets by sawing, laser machining, or other suitable techniques.

Figure 12A:
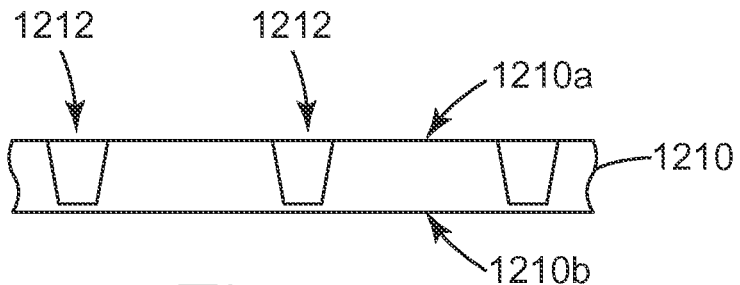
FIGS. 12a-d are schematic side views of an RSC carrier device or components thereof in different stages of manufacture, wherein a carrier window used in the construction includes blind vias.
Figure 12B:
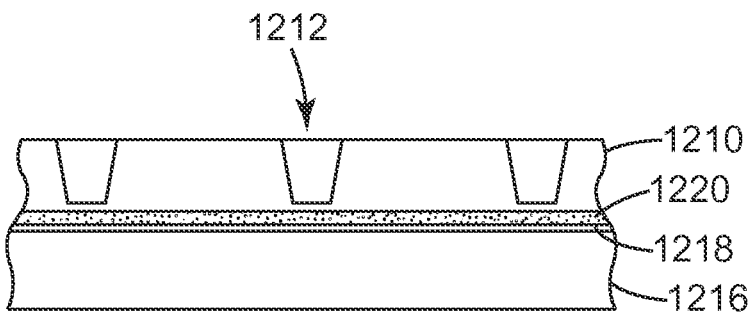
Figure 12C:
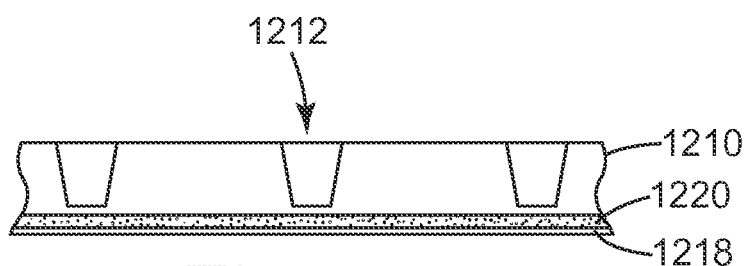
Figure 12D:
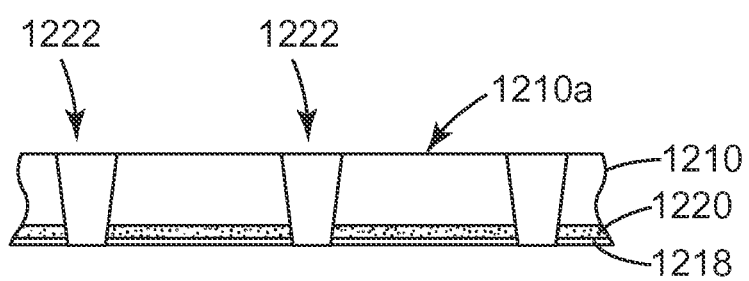

FIGS. 12a-d are schematic side views of an RSC carrier device or components thereof in different stages of manufacture, wherein a carrier window 1210 used in the construction includes blind vias 1212 (see FIG. 12a). The blind vias 1212 are open to a first major surface 1210a of the carrier window, but do not extend completely through to an opposed second major surface 1210b which is used for bonding. This design is advantageous because no filler material is required to prevent bonding material from escaping through the vias. A growth substrate 1216 with an RSC 1218 grown thereon is provided, and an adhesive or other bonding material 1220 is applied between the carrier window and the RSC, and allowed to cure (see FIG. 12b). After the bond is secure, the growth substrate 1216 is removed with an etchant or by any other suitable means, producing an RSC carrier device (see FIG. 12c). The blind vias 1212 are then extended through the layer of bonding material 1220 and through the RSC 1218 with a suitable wet etch or other means to form through vias 1222 (see FIG. 12d). Thereafter, the construction can be subdivided into platelets by sawing, laser machining, or other suitable techniques.

EXAMPLE 1

Platelet Fabrication Using Norland Optical Adhesive

RSC carrier devices in platelet form were fabricated from II-VI epitaxial layers grown by molecular beam epitaxy on a III-V semiconductor substrate in wafer form. The nominal epitaxial layers (including the InP substrate and GaInAs buffer layer) are listed in Table 1 below. The layer arrangement of the RSC was designed for the inverted orientation configuration discussed above, wherein the starting surface of the RSC is designed to be the illumination surface of the RSC, through which pump light enters the RSC. This can be seen, for example, by virtue of the placement of the cyan blocker layer (growth sequence #15) between the active area of the RSC (the layers of growth sequence #5-13) and the ending surface of the RSC (the exterior surface of the cyan blocker layer).

TABLE 1

| Growth sequence | Composition | Thickness (nm) | Band gap wavelength | Comment |
|---|---|---|---|---|
| 15 | CdMgZnSe: Cl | 2000 | 500 | Cyan blocker |
| 14 | CdMgZnSe: Cl | 79.5 | 480 --> 500 | Grading layer |
| 13 | CdMgZnSe: Cl | 58.9 | 480 | Absorbing layer |
| 12 | CdZnSe | 2.4 | 573 | Quantum well |
| 11 | CdMgZnSe: Cl | 117.8 | 480 | Absorbing layer |
| 10 | CdZnSe | 2.4 | 573 | Quantum well |
| 9 | CdMgZnSe: Cl | 117.8 | 480 | Absorbing layer |
| 8 | CdZnSe | 2.4 | 573 | Quantum well |
| 7 | CdMgZnSe: Cl | 117.8 | 480 | Absorbing layer |
| 6 | CdZnSe | 2.4 | 573 | Quantum well |
| 5 | CdMgZnSe: Cl | 58.9 | 480 | Absorbing layer |
| 4 | CdMgZnSe: Cl | 250 | 415 --> 480 | Grading layer |
| 3 | CdMgZnSe | 1000 | 415 | Window layer |
| 2 | CdZnSe | 3.2 | 551 | |
| 1 | GaInAs | 200 | | III-V buffer layer |
| | InP | (very large) | | III-V base layer |

The II-VI layer stack (growth sequence 2-15) forms an RSC that has 4 potential wells. After growing these layers on the III-V substrate, light extraction features, in the form of a regular array or pattern of depressions or pits, were etched into the exposed major surface of the RSC, i.e., the ending surface of the cyan blocker layer. The pit pattern was achieved with conventional contact photolithography and wet etching. Futurrex PR1-1000A photoresist was patterned to make apertures or openings of approximately 2 µm diameter, and arranged in a hexagonal pattern with a center-to-center spacing of 4 µm. The exposed surface of the RSC was etched in a solution of 100 ml $H_2O$:20 ml HBr:1 ml $Br_2$ (by volume) for about 40 seconds. Because of undercutting, this resulted in etch pits that were approximately hemispherical with a radius of about 2 µm. After removal of the photoresist, the textured side of the construction, i.e., the ending surface of the RSC, was bonded to a glass microscope slide cover which served as carrier window, using Norland 83H thermally-cured adhesive, and cured on a 120° C. hotplate. The slide cover was substantially transparent to all visible light, and had a thickness of about 167 microns and lateral dimensions of 25 mm×25 mm. In comparison, the growth substrate wafer and RSC had lateral dimensions of 20 mm×20 mm. To prevent flexing, the slide cover was reinforced by attaching one side of it to a microscope slide using a wax, before attaching the other side of the slide cover to the RSC/substrate wafer. The InP base layer was removed by brief mechanical lapping, followed by etching in a solution of 3:1 HCl:$H_2O$. The etchant stopped at the GaInAs buffer layer (growth sequence #1). This buffer layer was then removed in an agitated solution of 30 ml ammonium hydroxide (30% by weight), 5 ml hydrogen peroxide (30% by weight), 40 g adipic acid, and 200 ml water, leaving only the II-VI RSC (layers #2-15 of the growth sequence) attached to the microscope slide cover and to the reinforcing microscope slide. The exposed, thin CdZnSe layer (layer 2), which has lower band gap than the window layer, and which thus would absorb light at the pump wavelength, was also removed by a short plasma etch in argon, using an inductively-coupled plasma reactive-ion etching (ICP-RIE) system (Oxford Instruments). Etching conditions include ~85 sec@100 W RF power. Alternatively, this layer can be removed by wet etchant techniques suitable for etching II-VI compounds—including HBr:H2O:Br2 or Br2:methanol.

The microscope slide was then removed from the construction, so that all that remained was the II-VI layer stack constituting the RSC, attached to the slide cover, forming an RSC carrier device that could be handled in the laboratory without breakage and without damage to the RSC. Mechanical dicing was used to cut the RSC carrier device into platelet format. A Disco dicing saw with 20 µm diamond blade was used to cut the sample into 1 mm×1 mm squares. The effectiveness of these platelets was tested by bonding them to Lumileds Rebel flip chip LEDs. A tiny drop of Sylgard184 thermal-cure silicone was dispensed onto a given LED, and an RSC carrier device platelet was then bonded to the LED in a die bonder. The bonded sample was cured at 125° C. for 10 minutes. Optical measurements indicated that majority of the blue LED pump light was converted into green (re-emitted) light, and very little of the blue pump light escaped through the bonding adhesive.

Although the example above is based on II-VI semiconductor RSC layers, other types of RSC layers, including those made entirely from III-V semiconductors, are also contemplated.

As exemplified by the use of a reinforcing microscope slide in the example above, it may be desirable, e.g. when working with particularly thin carrier windows, to provide some mechanical reinforcement to the carrier window during fabrication for increased reliability. In one approach, one side of a thin carrier window may be bonded to the RSC, and the other side of the carrier window may be bonded to a wafer tape that is reinforced with a rigid plate or similar reinforcing member. After the growth substrate is removed from the RSC, and optionally after the resulting RSC carrier device is diced into platelets, then the reinforcing member can be removed from the backside of the wafer tape, and the very thin platelets can be handled on the tape, e.g., by removing them individually from the tape using pick-and-place equipment.

EXAMPLE 2

Platelet Fabrication Using RSC with CdZnSe Buffer

RSC carrier devices in platelet form were fabricated from II-VI epitaxial layers grown by molecular beam epitaxy on a III-V semiconductor substrate in wafer form in a manner similar to that described in Example 1. The nominal epitaxial layers (including the InP substrate and GaInAs buffer layer) are listed in Table 2 below. The layer arrangement of the RSC was designed for the inverted configuration discussed above, wherein the starting surface of the RSC is designed to be the illumination surface of the RSC, through which pump light enters the RSC. This can be seen, for example, by virtue of the placement of the cyan blocker layer (growth sequence #16) between the active area of the RSC (the layers of growth sequence #7-15) and the ending surface of the RSC (the exterior surface of the cyan blocker layer). In addition, the CdZnSe layer (growth sequence #2 and 3) is added adjacent to the GaInAs to provide a buffer layer between the III-V buffer and the RSC. Note that the thin CdZnSe layer (layer 2), which has lower band gap than the window layer, and which thus would absorb light at the pump wavelength, was also removed by a short plasma etch in argon, using an inductively-coupled plasma reactive-ion etching (ICP-RIE) system (Oxford Instruments). Etching conditions include ~85 sec@100 W RF power. Alternatively, this layer can be removed by wet etchant techniques suitable for etching II-VI compounds—including HBr:H2O:Br2 or Br2:methanol.

TABLE 2

| Growth sequence | Composition | Thickness (nm) | Band gap wavelength | Comment |
|---|---|---|---|---|
| 16 | CdMgZnSe: Cl | 1500 | | Cyan blocker |
| 15 | CdMgZnSe: Cl | 500 | | Absorbing layer |
| 14 | CdZnSe | 2.4 | | Quantum well |
| 13 | CdMgZnSe: Cl | 120 | | Absorbing layer |
| 12 | CdZnSe | 2.4 | | Quantum well |
| 11 | CdMgZnSe: Cl | 120 | | Absorbing layer |
| 10 | CdZnSe | 2.4 | | Quantum well |
| 9 | CdMgZnSe: Cl | 120 | | Absorbing layer |
| 8 | CdZnSe | 2.4 | | Quantum well |
| 7 | CdMgZnSe: Cl | 120 | | Absorbing layer |
| 6 | CdMgZnSe | 251.1 | | Grading layer |
| 5 | CdMgZnSe | 1000 | | Window layer |
| 4 | CdMgZnSe: Cl | 225 | | Grading layer |
| 3 | CdZnSe: Cl | 500 | | II-VI buffer layer |
| 2 | CdZnSe | 3.4 | | |
| 1 | GaInAs | 200 | | III-V buffer layer |
| | InP | (very large) | | III-V base layer |

The II-VI layer stack (growth sequence 2-16) forms an RSC that has 4 potential wells. After growing these layers on the III-V substrate, light extraction features, in the form of a regular array or pattern of holes, were etched into the exposed major surface of the RSC, i.e., the ending surface of the cyan blocker layer. The hole pattern was achieved with conventional contact photolithography and wet etching. Futurrex PR1-1000A photoresist was patterned to make holes of approximately 2 µm diameter, and arranged in a square "checkerboard" pattern having a period of 4 µm in both directions. The exposed surface of the RSC was etched in a solution of 100 mL $H_2O$:20 mL HBr:0.25 mL $Br_2$ (by volume) for about 4 minutes. The etched holes had a depth of ~1.0 µm. After removal of the photoresist, the textured side of the construction, i.e., the ending surface of the RSC, was bonded to a piece of a 500 µm thick, Borofloat 33 glass wafer which served as carrier window, using Norland 83H adhesive, and cured for 20 sec by exposure to UV light (~75 mW/mm$^2$@365 nm). The InP base layer was removed by brief mechanical lapping, followed by etching in a solution of 3:1 HCl:$H_2O$. The etchant stopped at the GaInAs buffer layer (growth sequence #1). This buffer layer was then removed in an agitated solution of 30 mL ammonium hydroxide (30% by weight), 5 mL hydrogen peroxide (30% by weight), 40 g adipic acid, and 200 mL water, leaving only the II-VI RSC attached to the glass wafer. Layers 2-6 were removed by Ar etching using an inductively-coupled plasma reactive-ion etching (ICP-RIE) system (Oxford Instruments). Etching conditions include ~85 sec@100 W RF power. (Alternatively, these layers can also be removed by wet etchant techniques suitable for etching II-VI compounds—including HBr:H$_2$O:Br$_2$ or Br$_2$:methanol.) A protective layer (10 nm TiO$_2$ followed by 500 nm SiO$_2$) was applied to the RSC carrier device via e-beam evaporation. The RSC carrier device was then diced into platelet format with a Disco dicing saw having a 150 μm diamond blade. The individual platelets were ~1.5 mm×1.5 mm. These RSC platelets were attached to blue pump LEDs using the process described in Example 1. Optical measurements indicated that the majority of the blue LED pump light was converted into green (re-emitted) light, and very little of the blue pump light escaped through the bonding adhesive.

EXAMPLE 3

Platelet Fabrication Using Silicone Adhesive

A green emitting semiconductor platelet was produced as follows. A multilayer, quantum well RSC was prepared on an InP substrate using molecular beam epitaxy (MBE) in a similar manner to that described in Example 1. The surface of the as-grown RSC was prepared for silica deposition by treating with oxygen and argon plasma respectively (200 mTorr, 50 W, 12 second exposure to each plasma) in Technics MicroRIE Series 80 machine equipped with 6" parallel electrodes 10 nm of titanium oxide followed by 500 nm of silicon dioxide was deposited on top of the converting layer using e-beam evaporation. AP3000 adhesion promoter solution (Dow Corning, Midland, Mich.) was coated on the exposed silica surface of the RSC by spin coating at 3000 rpm for 30 seconds.

Four inch diameter, 500 um thick, Borofloat 33 glass wafers were purchased from Schott Glass (Elmsford, N.Y.). The glass wafers were cleaved into smaller pieces and then cleaned by sonication in Isopropyl Alcohol (IPA) solution for 30 minutes followed by rinsing with acetone, methanol and finally with IPA. This rinse was done two times and rinse solvents were not allowed to dry between each rinse. The Borofloat 33 glass wafers were nitrogen dried and AP3000 adhesion promoter applied by spin coating.

Sylgard 184 silicone adhesive, purchased from Dow Corning (Midland, Mich.), was mixed in the ratio of ten parts base to one part curing agent, as described in the manufacturer's specification.

A few small drops of the mixed adhesive were applied to the prepared Borofloat 33 wafer surface. The prepared RSC was placed on top with the silicon dioxide surface contacting the adhesive The Borofloat 33 and the RSC were pressed together manually with light pressure for at least 45 seconds to allow the adhesive to flow to the sides and into a thin layer between the two surfaces. The sample was allowed to sit for one minute, then placed on a hot plate to cure at 125° C. over 30 minutes. The Borofloat 33 glass wafer piece had a larger area than the RSC on top.

Following curing, the InP substrate was mechanically lapped under water using 500 grit sandpaper. The bonded, lapped sample was placed on a hot plate that was set to 100° C. and CrystalBond 509 wax was applied to the Borofloat wafer top surface around the semiconductor wafer to protect the edges. Wax was applied to all of the side edges of the InP and to the 2-3 mm of top edge area of the lapped InP. Care was taken to make sure none of the edge of the semiconductor converter was left exposed. Samples were removed quickly from the hotplate after the application of the wax.

The InP substrate was removed by etching in a room temperature solution of 3HCl:1H$_2$O. This etchant stops at the GaInAs buffer layer in the wavelength converter. The buffer layer was subsequently removed in an agitated solution of 30 ml ammonium hydroxide (30% by weight), 5 ml hydrogen peroxide (30% by weight), 40 g adipic acid, and 200 ml water, leaving only the II-VI semiconductor wavelength converter bonded with silicone to the Borofloat 33 wafer. The protective CrystalBond wax was removed with acetone. Finally, the samples were diced into one square millimeter devices. The adhesive bond thickness was measured to be 4-5 um.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A re-emitting semiconductor construction (RSC) carrier device for use with an electroluminescent device, comprising:
   a stack of epitaxial semiconductor layers, the stack being adapted to convert light at a first wavelength $\lambda_1$ to visible light at a second wavelength $\lambda_2$; and
   a carrier window attached to the stack, the carrier window substantially transmitting light at the second wavelength $\lambda_2$, and the carrier window being a glass carrier window that is attached to the stack by an adhesive, the adhesive being disposed as a layered structure on an ending surface of the stack and being sandwiched between the glass carrier window and the stack of epitaxial semiconductor layers to bond the glass carrier window to the stack.

2. The device of claim 1, wherein the carrier window has a maximum lateral dimension at least as large as that of the stack, and wherein the carrier window is sufficiently rigid to allow handling of the device without substantial damage to the semiconductor stack.

3. The device of claim 1, wherein the ending surface of the stack comprises a plurality of light extraction features facing towards the carrier window.

4. The device of claim 1, further comprising:
   a second window attached to the stack such that the stack is disposed between the carrier window and the second window, the second window substantially transmitting light at the first wavelength $\lambda_1$.

5. The device of claim 1, wherein the semiconductor layer stack includes a first potential well and a first absorbing layer closely adjacent to and having a band gap energy greater than a transition energy of the first potential well.

6. The device of claim 1, further comprising an electroluminescent device optically coupled to the stack of semiconductor layers and configured to emit light at the first wavelength.

7. The device of claim 1, wherein the adhesive is substantially transparent to the light at the second wavelength $\lambda_2$.

8. The device of claim 1, wherein the adhesive has a lower refractive index than the carrier window.

9. The device of claim 1, wherein the carrier window has a thickness of at least 10 microns, and the carrier window is thicker than the stack.

* * * * *

UNITED STATES PATENT AND TRADEMARK OFFICE
CERTIFICATE OF CORRECTION

PATENT NO. : 9,293,622 B2
APPLICATION NO. : 13/264487
DATED : March 22, 2016
INVENTOR(S) : Terry Smith It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 524 days.

Signed and Sealed this
Second Day of August, 2016

Michelle K. Lee
*Director of the United States Patent and Trademark Office*